United States Patent [19]

Kutzer

[11] Patent Number: 5,638,051
[45] Date of Patent: Jun. 10, 1997

[54] METHOD AND APPARATUS FOR MONITORING AN ELECTRICAL DRIVE

[75] Inventor: Heinz Kutzer, Maintal, Germany

[73] Assignee: Siemens Aktiengesellschaft, Munich, Germany

[21] Appl. No.: 584,729

[22] Filed: Jan. 11, 1996

Related U.S. Application Data

[63] Continuation of Ser. No. 232,520, filed as PCT/DE92/00857, Oct. 12, 1992,, abandoned.

[30] Foreign Application Priority Data

Oct. 25, 1991 [DE] Germany .................. 41 35 287.4

[51] Int. Cl.$^6$ ................................................ G08B 21/00
[52] U.S. Cl. .................. 340/635; 340/657; 340/660; 340/664; 361/93; 361/94
[58] Field of Search ........................ 340/660, 661, 340/662, 663, 664, 635, 657; 361/93, 94

[56] References Cited

U.S. PATENT DOCUMENTS

| | | |
|---|---|---|
| 3,947,764 | 3/1976 | Abbott et al. . |
| 4,442,471 | 4/1984 | Trayer ........................ 361/63 |
| 4,466,039 | 8/1984 | Moran et al. ................ 361/35 |
| 4,616,179 | 10/1986 | Braun . |
| 4,692,920 | 9/1987 | Tannhäuser et al. . |
| 4,794,328 | 12/1988 | Fernandes et al. ........... 324/127 |
| 4,829,234 | 5/1989 | Gretsch . |
| 4,839,830 | 6/1989 | Amey et al. . |
| 4,968,929 | 11/1990 | Hauck et al. . |
| 5,003,252 | 3/1991 | Nystrom . |
| 5,086,367 | 2/1992 | Ishii et al. ................... 361/94 |
| 5,136,457 | 8/1992 | Durivage, III ............... 361/93 |
| 5,172,062 | 12/1992 | Eisermann . |
| 5,185,705 | 2/1993 | Farrington .................. 364/483 |
| 5,274,313 | 12/1993 | Amrhein . |

FOREIGN PATENT DOCUMENTS

| | | |
|---|---|---|
| 0120749 | 10/1984 | European Pat. Off. . |
| 0193761 | 9/1986 | European Pat. Off. . |
| 0240684 | 10/1987 | European Pat. Off. . |
| 0301358 | 2/1989 | European Pat. Off. . |
| 0355255 | 2/1990 | European Pat. Off. . |
| 2917529 | 11/1980 | Germany . |
| 2534343 | 12/1982 | Germany . |
| 3237365 | 8/1987 | Germany . |
| 3713262 | 11/1988 | Germany . |
| 3941495 | 6/1990 | Germany . |
| 3923545 | 1/1991 | Germany . |
| 1144061 | 6/1983 | U.S.S.R. . |
| 2239320 | 6/1991 | United Kingdom . |

OTHER PUBLICATIONS

1991 Derwent Publications Ltd. No. 91–123651/17, SU 1450–607–A.

Japanese Patent Abstract No. 62–218883 (Hamano), Sep. 26, 1987.

Japanese Patent Abstract No. 62–56876 (Kuno), dated Mar. 12, 1987.

"Brockhaus Naturwissenschaften und Technik", vol. 1, 1983, p. 302.

Primary Examiner—Thomas Mullen
Assistant Examiner—Edward Lefkowitz
Attorney, Agent, or Firm—Herbert L. Lerner; Laurence A. Greenberg

[57] ABSTRACT

A method for monitoring an electrical drive, in particular a drive of an armature, having electric supply lines being extended through a switchgear plug-in unit associated with the drive and being connected at the plug-in unit to a measurement and evaluation unit, includes connecting at least one of the supply lines to the measurement and evaluation unit through a current transformer, and simultaneously operating and monitoring the drive with the plug-in unit. An apparatus for monitoring the electrical drive includes a switchgear plug-in unit associated with the drive. Electric supply lines of the drive extend through the plug-in unit. Voltage pickups and current pickups are disposed at the plug-in unit for a measurement and evaluation unit. Voltage measuring lines in the plug-in unit begin at the supply lines and end at the voltage pickups. Current transformers in the plug-in unit are associated with the supply lines without interrupting the supply lines. Current measuring lines connect the current transformers to the current pickups.

5 Claims, 2 Drawing Sheets

METHOD AND APPARATUS FOR MONITORING AN ELECTRICAL DRIVE

This application is a continuation of application Ser. No. 08/232,520, filed Apr. 22, 1994, now abandoned.

CROSS-REFERENCE TO RELATED APPLICATION

This application is a Continuation of International Application Ser. No. PCT/DE92/00857, filed Oct. 12, 1992.

BACKGROUND OF THE INVENTION

1. Field of the Invention

The invention relates to a method for monitoring an electrical drive, in particular a drive of an armature, wherein electric power supply lines of the drive, which extend through a switchgear plug-in unit associated with the drive, are connected to a measurement and evaluation unit.

The invention also relates to an apparatus for monitoring an electrical drive, in particular a drive of an armature, wherein electrical power supply lines of the drive extend through a switchgear plug-in unit associated with the drive and wherein pickups for a measurement and evaluation unit are disposed at the plug-in unit.

The functional status of an armature is monitored by monitoring an electrical drive of the armature. In that way, trouble or changes in the operating performance of the armature can be recognized early. Such troubles do not yet impair the reliability of the armature but can cause later safety-relevant damage to the armature. The early recognition of the trouble makes it possible to repair or replace the armature in time. Consequently, safety-relevant damage does not occur, and such damage must especially be avoided in plants or systems with stringent requirements for safety or availability. Such plants or systems may be nuclear power plants, manufacturing plants, or chemical plants.

Electric power lines of a drive are typically extended through a plug-in unit of switchgear. Such a plug-in unit is known from Brockhaus Naturwissenschaften und Technik [Brockhaus Natural Sciences and Technology], Vol. 1, 1983, page 302. One such plug-in unit is available for each drive. Located in such a plug-in unit are a control unit and other electronic components. A voltage power unit and contactors for the drive are also disposed in it.

A testing method and a testing unit for an electrical drive is known from German Patent DE 29 17 529 C2.

In a method for monitoring a drive which is known from Published European Application No. 0 301 358 A1, corresponding to U.S. Pat. No. 4,829,234, a resistor is incorporated into the current circuit of the drive in order to measure the current intensity. That impairs operation of the drive during the measurement process.

It is known from Published European Application No. 0 355 255 A2 to mount a component on a unit for measurement purposes. The component, which includes electrical and electronic parts, impairs the operation of the unit during the measurement.

With the known methods and apparatuses, either the availability of the drive and in particular of an armature is restricted by the tests which are required, or else intervention must be made into the operation of the system or the plant containing the drive, in order to test the drive. In order to keep the disruption in operation slight, testing can therefore be done only at intervals over time. From that it can be concluded that individual problems or trouble occurring between tests cannot be detected.

In the event that a plug-in unit which, for instance, is known from Brockhaus Naturwissenschaften und Technik, is associated with the drive to be monitored, it is conventional, in order to carry out monitoring of a drive, to remove the corresponding plug-in unit from the switchgear and replace it with a plug-in measurement unit.

The drive is accordingly relieved of its own task. An armature moved by the drive is stopped, so that the drive can be tested within a limited measurement test run.

It may be necessary, after removal of the plug-in unit, to insert a plug-in adapter unit with which measuring instruments can be connected.

A known plug-in measurement unit or plug-in adapter unit contains different cabling from a plug-in unit intended for long-term operation. Line bindings for the voltage measurement are located in the measuring plug-in unit, on the electric power lines of the drive. Those lines are connected to voltage pickups, which are constructed as plug contacts, on the plug-in measurement unit. In order to measure current intensity, the power lines in the plug-in measurement unit are interrupted. The two ends of a line are connected to a voltage pickup in the form of plug contacts on the measurement plug-in unit.

The plug-in measurement unit differs from the plug-in unit for normal operation of the drive in particular in that the power lines are interrupted for the current intensity measurement.

As a rule, the measurement and evaluation unit is connected to the voltage and current pickups of the plug-in measurement unit. In it, the effective power is determined from the voltage and from the current intensity and is a measure of the status of an armature.

The known method and the apparatus suitable for performing it are complicated and difficult to handle. In the case of each monitoring operation, not only must the drive to be monitored be out of operation, which affects the operation of the entire system or plant, but moreover the plug-in unit associated with the drive in the switchgear must be replaced with a plug-in measurement unit or a plug-in adapter unit. The frequent replacement of plug-in units in the switchgear can cause damage to the plug-in units or the switchgear. Continued operation of a drive and therefore of an armature during the test process is not possible, since the power lines are interrupted when the plug-in units are changed.

SUMMARY OF THE INVENTION

It is accordingly an object of the invention to provide a method and an apparatus for monitoring an electrical drive, particularly the drive of an armature, which overcome the hereinafore-mentioned disadvantages of the heretofore-known methods and devices of this general type and which can be used not only with a drive that is stopped beforehand. Instead, monitoring of the drive should be possible continuously during normal use of the drive. Moreover, no major interventions into the system or plant, and in particular into the power lines of the drive, should be necessary. A drive should remain continuously available during its testing.

With the foregoing and other objects in view there is provided, in accordance with the invention, in a method for monitoring an electrical drive, in particular a drive of an armature, having electric supply lines being extended through a switchgear plug-in unit associated with the drive and being connected at the plug-in unit to a measurement and evaluation unit, the improvement which comprises connecting at least one of the supply lines to the measurement and evaluation unit through a current transformer, and simultaneously operating and monitoring the drive with the plug-in unit.

Thus an advantage is attained on one hand that changing plug-in units is unnecessary for monitoring purposes. Shutdown of the drive caused by the monitoring does not occur. Instead, the monitoring can proceed during normal use of the drive. On the other hand, an advantage is attained that in the measuring method, no intervention is made into the function of the drive. This can be ascribed to the use of one or more current transformers on the power lines. Heretofore, professionals in the field believed such use of current transformers in a plug-in unit to be impossible. The current transformers should be connected to the measurement and evaluation unit.

In accordance with another mode of the invention, one such current transformer is an inductive current transformer for alternating current or a Hall generator for direct current.

Voltage measurement at a known shunt, which is disposed in the power line, can also be used to determine the current intensity.

The use of a current transformer makes it possible for the first time to make do without a separate plug-in measurement unit. That is, because of the current transducers, the power line need not be interrupted for the current intensity measurement. Coupling for current intensity measurement by current transformers, whenever no monitoring is to be done, does not impede the flow of current through the power lines. With the current transformer, current intensity measurements can be performed quickly. Continuous monitoring of the drive is even possible. As a result of the continuous monitoring of the drive, troubles that appear only intermittently and briefly can also be detected.

In accordance with a further feature of the invention, the plug-in unit outputs a coding signal that identifies itself to the measurement and evaluation unit. As a result, the measurement and evaluation unit learns which plug-in unit and therefore which drive it is connected to at that moment.

With the objects of the invention in view, there is also provided an apparatus for monitoring an electrical drive, in particular a drive of an armature, comprising a switchgear plug-in unit associated with an electrical drive; electric supply lines of the drive extending through the plug-in unit; a measurement and evaluation unit; voltage pickups and current pickups disposed at the plug-in unit for the measurement and evaluation unit; voltage measuring lines in the plug-in unit beginning at the supply lines and ending at the voltage pickups; current transformers in the plug-in unit being associated with the supply lines without interrupting the supply lines; and current measuring lines connecting the current transformers to the current pickups.

This has the advantage of ensuring that the integrity of the power lines is unaffected by voltage and current intensity measurement. Particularly in an alternating current drive, inductive current transformers are used, for which purpose the power lines can remain unharmed. Since the power lines are not impaired by the monitoring, the same plug-in unit can be used simultaneously for operating and for monitoring the drive. Monitoring can even be done during operation.

The use of an inductive current transformer in such a plug-in unit was previously impossible, because small enough current transformers that could be accommodated in a plug-in unit of a given size were not available. Adequately small-sized current transformers, that were developed intentionally for use in the apparatus according to the invention, make it possible for the first time to construct the apparatus for monitoring an electrical drive according to the invention.

Accordingly, the small current transformers make it possible for the first time to carry out the method according to the invention.

In accordance with another feature of the invention, in a direct current drive, direct current transformers are associated with the power lines. One suitable direct current transformer is a Hall generator. The usual direct current transformers, like the inductive current transformers, function in contactless fashion. In other words, in a direct-current drive, the same plug-in unit can be used simultaneously for operating and for monitoring the drive.

In accordance with a further feature of the invention, if the power lines include shunts in a direct-current drive, in other words resistors in the milliohm range, then one shunt voltage measuring line can begin on each side of a shunt of a power line and end at the current pickups. In that case, with given known properties of the shunt and in particular with a known resistance of the shunt, the current intensity in the power line can be determined in the evaluation unit from the voltage at the shunt. In combination with the evaluation unit, the shunt serves as a current transformer, and the shunt voltage measuring lines serve as current measuring lines.

In accordance with an added feature of the invention, there is provided a diagnosis plug, which is connected to the measurement and evaluation unit and is associated with the voltage pickups and the current pickups on the plug-in unit. The diagnosis plug is constructed in such a way that it supervises the voltage and current pickups of the plug-in unit. This has the advantage of ensuring that the measurement and evaluation unit can be rapidly connected to a plug-in unit and also rapidly disconnected from it. This is useful if the diagnosis plug of a measurement and evaluation unit supervises all of the plug-in units, each of which is associated with one drive. In that case advantageously only one measurement and evaluation unit is needed, with which all of the electrical drives can be monitored in succession. All that needs to be done is to connect the diagnosis plug successively to the various plug-in units.

In accordance with an additional feature of the invention, the plug-in unit has a coding pickup, at which a coding signal is present that identifies the drive with which the plug-in unit is associated. The diagnosis plug also receives the coding pickup, as it does with all of the pickups. Extending from the plug is a line for the coding signal leading to the measurement and evaluation unit. The advantage attained with the coding of the plug-in units is that through the coding signal, the measurement and evaluation unit is immediately informed about which plug-in unit the diagnosis plug is connected to at that moment. In other words there can be no uncertainty as to which drive is being monitored at the moment.

In accordance with yet a concomitant feature of the invention, two poles of a current pickup are conductively connected to one another in the plug-in unit, as long as no diagnosis plug is mounted on the plug-in unit. It is not until a diagnosis plug is mounted that this connection between the two poles is mechanically interrupted. This has the advantage of ensuring that the inductive current transformers are short circuited, as long as they are not needed.

The advantage which is attained with the method and the apparatus according to the invention in particular is that during normal operation of a drive, monitoring of this drive can be done at any time quickly, without having to change plug-in units in switchgear. One or more plug-in units can even be monitored continuously, as long as a measurement and evaluation unit is connected to the corresponding plug-in unit. In this way, even troubles that occur only sporadically can be reliably detected. Defects in a drive can be detected quickly and unequivocally. Even trends in the performance of the drive can be detected. Nevertheless, the drive to be monitored is always available for its actual task. Advantageously, no interventions into the system plant of which the drive is a part are needed.

The coding of the plug-in units makes it possible to safely and reliably ascertain which drive is being tested at the moment.

Other features which are considered as characteristic for the invention are set forth in the appended claims.

Although the invention is illustrated and described herein as embodied in a method and an apparatus for monitoring an electrical drive, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
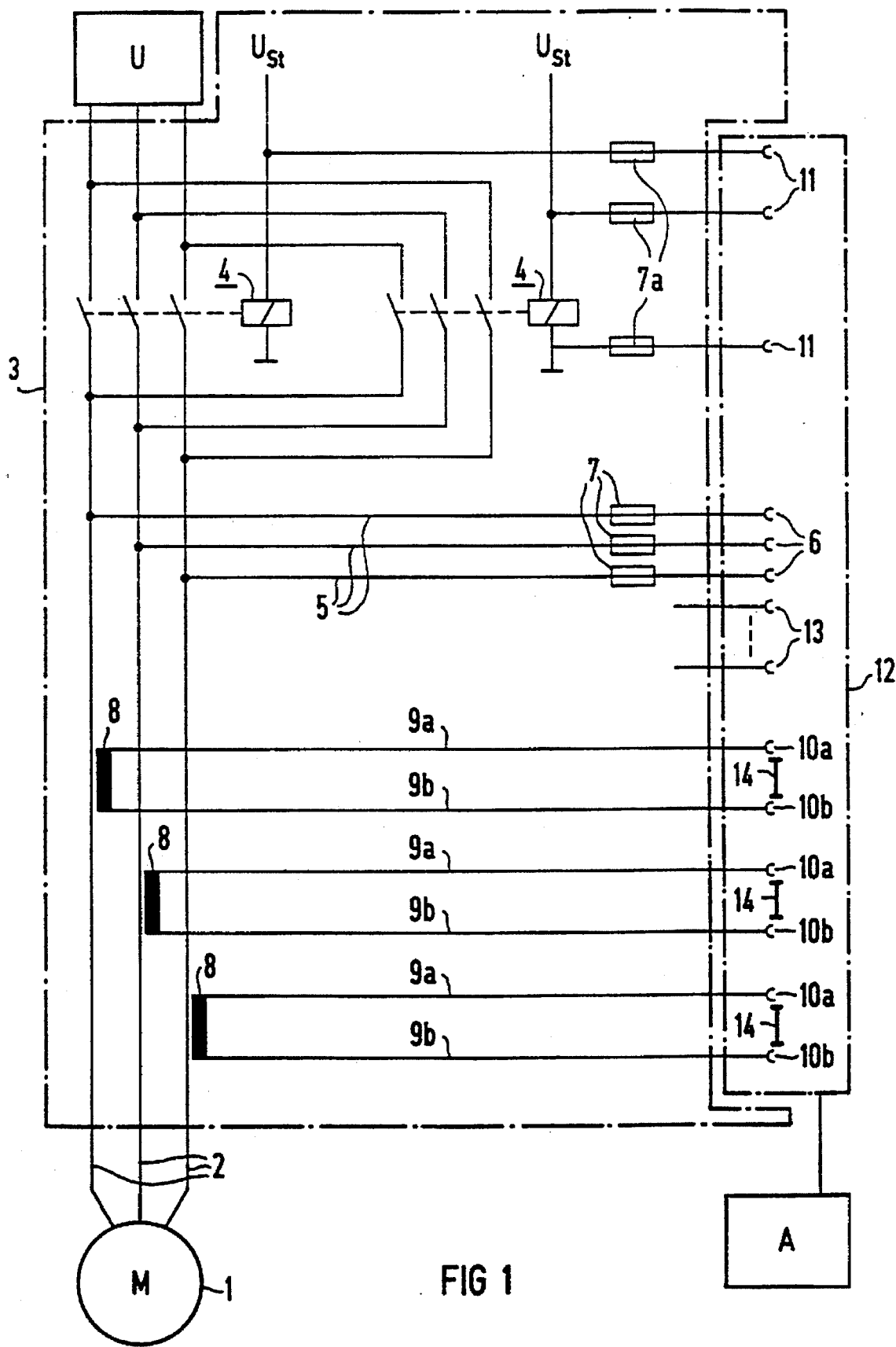
FIG. 1 is a schematic and block circuit diagram of a plug-in unit, which can be used simultaneously according to the invention for operating and for monitoring a drive.

Referring now to the figures of the drawing in detail and first, particularly, to FIG. 1 thereof, there is seen a drive 1, which may be a drive motor of an armature, that is connected to a voltage source U through power supply lines 2. A switchgear system has one plug-in unit 3 for each drive 1. In such a plug-in unit 3, the control of the drive 1 is effected by opening or closing switches or contactors 4 in the power supply lines 2 by applying control voltages $U_{sr}$. In the plug-in unit 3 according to the invention, one voltage measuring line 5 begins at each of the power supply lines 2 which voltage measuring lines 5 and ends at voltage pickups 6. Fuses 7 are incorporated into the voltage measuring lines 5.

In order to measure the current intensity in the power supply lines 2, each of these lines has an associated current transformer 8. If the drive 1 is an alternating-current drive, then the current transformer 8 is an inductive current transformer. If the drive 1 is a direct-current drive, then the current transformer 8 is a direct-current transformer, such as a Hall generator. These current transformers 8, particularly inductive current transformers, are dimensioned in such a way that they can be accommodated in a conventional plug-in unit 3. Such small current transformers were previously unknown. The current transformers 8 are each connected to respective current pickups 10a and 10b through two respective current measuring lines 9a and 9b.

Figure 2:
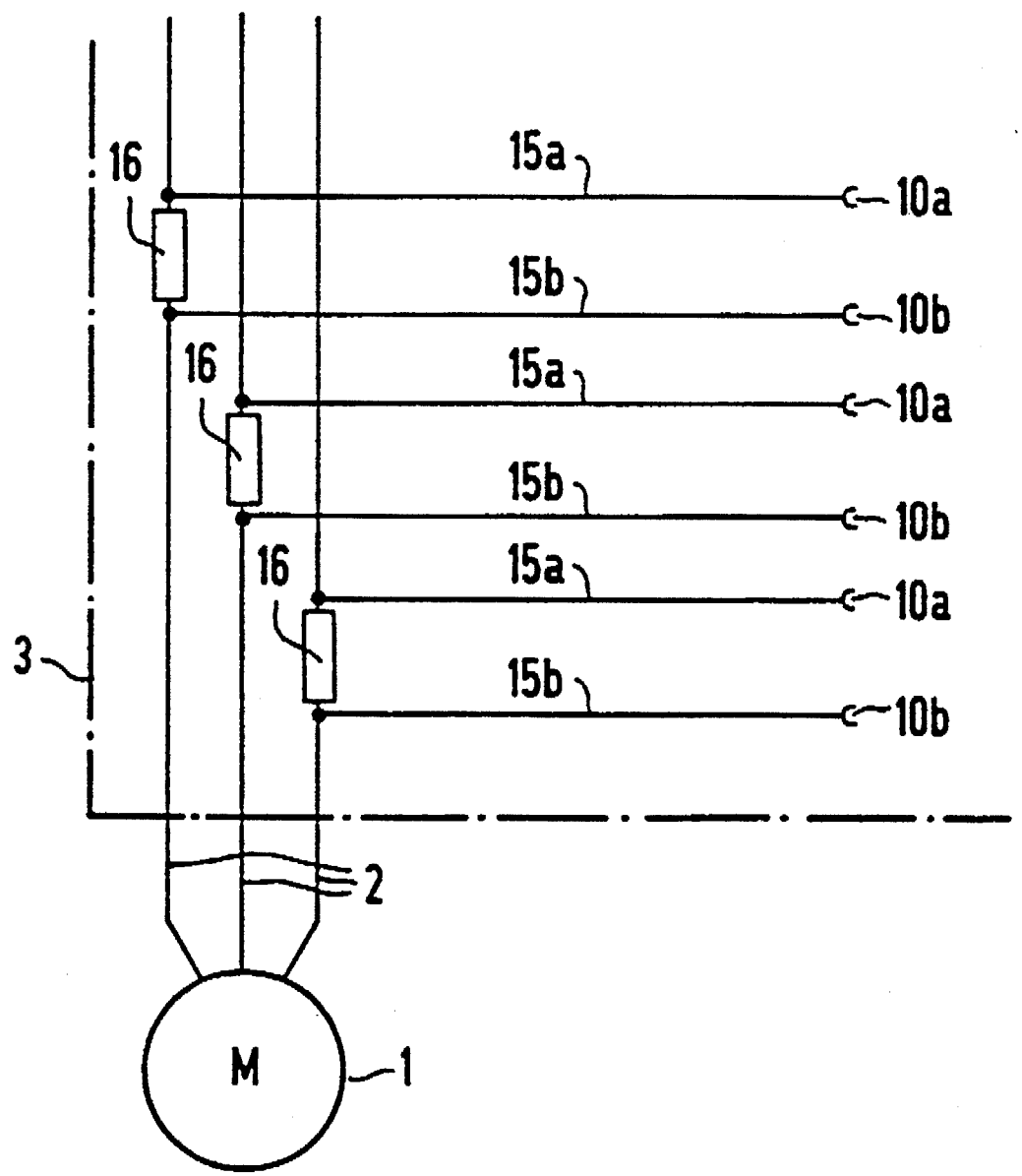
FIG. 2 is a schematic and block circuit diagram of a portion of a different embodiment of such a plug-in unit.

In accordance with FIG. 2, a shunt 16, which is connected to two shunt voltage measuring lines 15a, 15b that have the function of current measuring lines, can also serve as a "current transformer". In a direct-current drive 1, resistors in the milliohm range, which are so-called shunts 16, are often used in the power supply lines 2. At such a shunt 16, a voltage is picked up by the shunt voltage measuring lines 15a, 15b. These shunt voltage measuring lines 15a, 15b end at the current pickups 10a, 10b. In a measurement and evaluation unit, the current intensity in the power supply line 2 can be determined from the voltage measured at the shunt 16, by means of the known properties of the shunt 16, such as its electrical resistance, number of windings, etc.. The plug-in unit 3 of FIG. 1 may also have pickups 11 for the control voltage $U_{sr}$. Fuses 7a are associated with these pickups 11.

A diagnosis plug 12, which enters into contact with all of the pickups 6, 10a, 10b and optionally with the pickup 11, can be connected to a plug-in unit 3. The diagnosis plug 12 is connected to a measurement and evaluation unit A, for instance through cables. There, the voltages are measured or determined at the voltage pickups 6, and the current intensities are measured or determined at the current pickups 10a, 10b. The effective power is determined in a known manner from these two values and is a measure of the status of the drive 1. An effective power deviating from a command value is an indication of trouble in the drive 1 that has to be taken care of. Comparison of the individual current intensities and courses of current over time among current pickups 10a, 10b associated with various power supply lines 2 produces an indication as to the winding status of the drive motor. The control voltage pickups 11 can likewise be connected to the measurement and evaluation unit A, which may include a display unit. The control voltages may be used in combination with the effective power or with the voltages at the voltage pickups 6 or the currents at the current pickups 10a, 10b for ascertaining and evaluating the switching times of the switches or contactors 4.

A switchgear system includes many plug-in units 3. Each plug-in unit 3 is associated with a certain drive 1. In order to be able to learn the drive 1 to which a particular plug-in unit 3 belongs, the plug-in unit has a coding pickup 13, to which a coding circuit is connected. The coding circuit identifies the plug-in unit 3 and therefore the drive 1. The diagnosis plug 12 also includes devices for coupling to the coding pickup 13. Beginning at the diagnosis plug 12, it is not only the other pickups but also the coding pickup 13 that is connected to the measurement and evaluation unit A. The coding circuit is polled by the measurement and evaluation unit A and unequivocally indicates which drive 1 is being monitored at the moment.

If no diagnosis plug 12 is mounted on the plug-in unit 3, the two current pickups 10a and 10b of a current transformer 8 are connected conductively to one another by a short-circuit bridge 14. This short-circuit bridge 14 is mechanically interrupted when the diagnosis plug 12 is mounted on the plug-in unit 3.

The illustrated plug-in unit 3 according to the invention serves simultaneously to operate and to monitor the drive 1. In order to monitor the drive 1, it is no longer necessary to remove a plug-in unit 3. The drive 1 can be monitored continuously, so that trouble in the drive 1 can be detected quickly and reliably.

I claim:

1. An apparatus for monitoring an electrical drive having electric supply lines, the apparatus comprising:

a switchgear plug-in unit associated with a direct-current electrical drive and connected into supply lines of the electrical drive;

voltage pickups and current pickups disposed at said plug-in unit;

voltage measuring lines in said plug-in unit beginning at said supply lines and ending at said voltage pickups;

direct current transformers in said plug-in unit being associated with said supply lines without interrupting said supply lines;

current measuring lines connecting said current transformers to said current pickups;

a measurement and evaluation unit connected to said voltage pickups and to said current pickups for monitoring said electrical drive; and shunts being connected to said supply lines and having two sides and an electrical resistance, and shunt voltage measuring lines each beginning from said supply line at one of said sides of a respective one of said shunts and ending at a respective one of said current pickups, said measurement and evaluation unit determining current intensity from a shunt voltage and said electrical resistance of said shunt.

2. An apparatus for monitoring an electrical drive having electric supply lines, the apparatus comprising:

a switchgear plug-in unit associated with an electrical drive and connected into supply lines of the electrical drive;

voltage pickups and current pickups disposed at said plug-in unit;

voltage measuring lines in said plug-in unit beginning at said supply lines and ending at said voltage pickups;

current transformers in said plug-in unit being associated with said supply lines without interrupting said supply lines;

current measuring lines connecting said current transformers to said current pickups;

a measurement and evaluation unit connected to said voltage pickups and to said current pickups for monitoring said electrical drive; and a diagnosis plug being connected to said measurement and evaluation unit and being associated with said voltage pickups and said current pickups at said plug-in unit.

3. The apparatus according to claim 2, wherein said plug-in unit has a coding pickup to be connected to a coding circuit for identifying the drive with which said plug-in unit is associated, and said diagnosis plug is associated with said coding pickup for carrying a coding signal of the coding circuit to said measurement and evaluation unit.

4. The apparatus according to claim 2, including a short-circuit bridge in said plug-in unit forming a conductive connection between two poles of one of said current pickups, said connection being interrupted when said diagnosis plug is mounted at said plug-in unit.

5. The apparatus according to claim 3, including a short-circuit bridge in said plug-in unit forming a conductive connection between two poles of one of said current pickups, said connection being interrupted when said diagnosis plug is mounted at said plug-in unit.

* * * * *